(12) United States Patent
Someya et al.

(10) Patent No.: US 11,592,747 B2
(45) Date of Patent: Feb. 28, 2023

(54) RESIST UNDERLAYER FILM-FORMING COMPOSITION COMPRISING CARBONYL-CONTAINING POLYHYDROXY AROMATIC RING NOVOLAC RESIN

(71) Applicant: NISSAN CHEMICAL INDUSTRIES, LTD., Tokyo (JP)

(72) Inventors: Yasunobu Someya, Toyama (JP); Ryo Karasawa, Toyama (JP); Keisuke Hashimoto, Toyama (JP); Tetsuya Shinjo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/650,929

(22) PCT Filed: Dec. 12, 2013

(86) PCT No.: PCT/JP2013/083345
§ 371 (c)(1),
(2) Date: Jun. 10, 2015

(87) PCT Pub. No.: WO2014/092155
PCT Pub. Date: Jun. 19, 2014

(65) Prior Publication Data
US 2015/0316850 A1    Nov. 5, 2015

(30) Foreign Application Priority Data
Dec. 14, 2012   (JP) .............................. JP2012-273519

(51) Int. Cl.
| | | |
|---|---|---|
| G03F 7/09 | (2006.01) |
| G03F 7/11 | (2006.01) |
| C09D 161/12 | (2006.01) |
| H01L 21/02 | (2006.01) |
| H01L 21/027 | (2006.01) |
| H01L 21/311 | (2006.01) |
| H01L 21/033 | (2006.01) |

(52) U.S. Cl.
CPC .............. *G03F 7/11* (2013.01); *C09D 161/12* (2013.01); *G03F 7/091* (2013.01); *G03F 7/094* (2013.01); *H01L 21/0274* (2013.01); *H01L 21/0277* (2013.01); *H01L 21/02118* (2013.01); *H01L 21/02318* (2013.01); *H01L 21/31144* (2013.01); *H01L 21/0332* (2013.01); *Y10T 428/31942* (2015.04)

(58) Field of Classification Search
CPC ......... C09D 161/12; G03F 7/11; G03F 7/094; G03F 7/091; H01L 21/31144; H01L 21/0332; H01L 21/0274; H01L 21/0277; H01L 21/02118; H01L 21/02318; Y10T 428/31942

See application file for complete search history.

(56) References Cited

U.S. PATENT DOCUMENTS

| 3,299,167 A | * | 1/1967 | Knowlson | ............... C08L 61/34 |
|---|---|---|---|---|
| | | | | 264/328.6 |
| 3,505,128 A | * | 4/1970 | Masahiro | .................. C08F 8/44 |
| | | | | 148/251 |

(Continued)

FOREIGN PATENT DOCUMENTS

| JP | 01-280748 | * | 11/1989 | ............. G03F 7/022 |
|---|---|---|---|---|
| JP | H03-2867 A | | 1/1991 | |

(Continued)

OTHER PUBLICATIONS

Machine translation of WO 2012176767 (2012).*

(Continued)

*Primary Examiner* — Martin J Angebranndt
(74) *Attorney, Agent, or Firm* — Oliff PLC

(57) ABSTRACT

There is provided resist underlayer film for lithography process with high dry etching resistance, wiggling resistance, and heat resistance. Resist underlayer film-forming composition for lithography including polymer having unit structure of Formula (1): wherein A is hydroxy group-substituted $C_{6-40}$ arylene group derived from polyhydroxy aromatic compound; B is $C_{6-40}$ arylene group or $C_{4-30}$ heterocyclic group containing nitrogen atom, oxygen atom, sulfur atom, or combination thereof; $X^+$ is $H^+$, $NH_4^+$, primary ammonium ion, secondary ammonium ion, tertiary ammonium ion, or quaternary ammonium ion, T is hydrogen atom, $C_{1-10}$ alkyl group or $C_{6-40}$ aryl group that may be substituted with halogen group, hydroxy group, nitro group, amino group, carboxylate ester group, nitrile group, or combination thereof as substituent, or $C_{4-30}$ heterocyclic group containing nitrogen atom, oxygen atom, sulfur atom, or combination thereof, B and T may form $C_{4-40}$ ring together with carbon atom to which they are bonded.

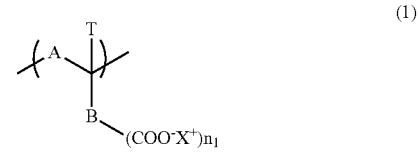

(1)

16 Claims, No Drawings

(56) References Cited

U.S. PATENT DOCUMENTS

| | | | | |
|---|---|---|---|---|
| 4,190,693 | A * | 2/1980 | Martorano | C09D 133/00 215/DIG. 2 |
| 5,115,074 | A * | 5/1992 | Umetani | C07C 65/105 525/450 |
| 5,456,996 | A * | 10/1995 | Ozaki | G03F 7/0236 430/165 |
| 7,317,063 | B2 * | 1/2008 | Swedo | C08G 8/10 524/540 |
| 8,853,031 | B2 * | 10/2014 | Ogihara | C08G 10/02 438/270 |
| 9,494,864 | B2 * | 11/2016 | Ohnishi | G03F 7/11 |
| 2006/0041078 | A1 * | 2/2006 | Takei | H01L 21/02118 525/329.7 |
| 2010/0047709 | A1 * | 2/2010 | Echigo | G03F 7/038 560/57 |
| 2012/0077345 | A1 * | 3/2012 | Saito | C08G 12/26 438/703 |
| 2012/0184103 | A1 * | 7/2012 | Ogihara | G03F 7/094 438/703 |
| 2012/0220112 | A1 * | 8/2012 | Hatakeyama | G03F 7/0397 438/514 |
| 2013/0171569 | A1 * | 7/2013 | Tachibana | G03F 7/004 430/287.1 |
| 2014/0363957 | A1 * | 12/2014 | Hatakeyama | G03F 7/094 438/514 |
| 2015/0011092 | A1 * | 1/2015 | Someya | C09D 161/26 524/592 |
| 2015/0248057 | A1 * | 9/2015 | Ohnishi | G03F 7/091 430/319 |
| 2017/0097568 | A1 * | 4/2017 | Endo | C09D 161/34 |
| 2019/0137878 | A1 * | 5/2019 | Tokunaga | H01L 21/0332 |
| 2020/0174370 | A1 * | 6/2020 | Nishimaki | C08L 61/18 |

FOREIGN PATENT DOCUMENTS

| | | | | |
|---|---|---|---|---|
| JP | 03-130774 | * | 6/1991 | |
| JP | 04-159326 | * | 6/1992 | |
| JP | 2001-114853 | * | 4/2001 | G03F 7/023 |
| JP | 2005-114921 A | | 4/2005 | |
| JP | 2007-199653 | * | 8/2007 | |
| JP | 2010-117629 A | | 5/2010 | |
| JP | 2010140760 A | * | 6/2010 | |
| JP | 2012-145897 | * | 8/2012 | |
| KR | 20100017795 A | * | 2/2010 | |
| WO | 2010/147155 A1 | | 12/2010 | |
| WO | 2012/077640 A1 | | 6/2012 | |
| WO | 2012/176767 A1 | | 12/2012 | |

OTHER PUBLICATIONS

Machine translation of JP 2001-114853 (2001).*
Jan. 14, 2014 Written Opinion issued in International Application No. PCT/JP2013/083345.
Jan. 14, 2014 International Search Report issued in International Application No. PCT/JP2013/083345.

* cited by examiner

RESIST UNDERLAYER FILM-FORMING COMPOSITION COMPRISING CARBONYL-CONTAINING POLYHYDROXY AROMATIC RING NOVOLAC RESIN

TECHNICAL FIELD

The present invention relates to a resist underlayer film-forming composition for lithography effective in processing of a semiconductor substrate, a method for forming a resist pattern using the resist underlayer film-forming composition, and a method for producing a semiconductor device.

BACKGROUND ART

Conventionally, in production of a semiconductor device, microprocessing by lithography using a photoresist composition has been carried out. The microprocessing is a processing method in which a thin film of the photoresist composition is formed on a substrate to be processed, such as a silicon wafer, is exposed to an active ray such as ultraviolet light through a mask pattern that has a pattern of a semiconductor device, and is developed, and the substrate to be processed such as a silicon wafer is etched using the obtained photoresist pattern as a protective coating. In recent years, high integration of the semiconductor device has advanced, the adopted active rays tend to have shorter wavelength such as an ArF excimer laser (193 mu), replacing a KrF excimer laser (248 nm). For this reason, diffuse reflection of active rays from the substrate and effects of standing wave have been severe problems. A method for providing an anti-reflective coating (Bottom Anti-Reflective Coating, BARC) between the photoresist and the substrate to be processed has been widely studied.

When miniaturization of the resist pattern advances, problems of resolution and collapse of developed resist pattern are caused. Therefore, a decrease in film thickness of a resist is desired. In this case, it is difficult to obtain a resist pattern film thickness sufficient for substrate processing. A process that imparts a function of a mask during substrate processing to not only the resist pattern but also a resist underlayer film that is formed between the resist and a semiconductor substrate to be processed is required. As a resist underlayer film for such processing, a resist underlayer film for lithography having a selection ratio of dry etching rate close to that of the resist, which is different from a conventional resist underlayer film having high etching rate, a resist underlayer film for lithography having a smaller selection ratio of dry etching rate than that of the resist, and a resist underlayer film for lithography having a smaller selection ratio of dry etching rate than that of the semiconductor substrate are required.

As a polymer used for a resist underlayer film-forming composition, a novolac resin of phenol, resorcinol, or naphthol with benzaldehyde or furfural has been disclosed (see Patent Document 1).

As the polymer used for the resist underlayer film-forming composition, a novolac resin obtained from a pyrene or a naphthalene having a hydroxy group or an aldehyde group and formalin has been described (see Patent Document 2).

A resist underlayer film-forming composition using a carbazole novolac resin, and a resist underlayer film-forming composition using a hydroxyl group-containing carbazole novolac resin have been described (see Patent Documents 3 and 4).

And there is a patent application about a resist underlayer film-forming composition containing a polyhydroxybenzene novolac resin (see Patent Document 5).

PRIOR ART DOCUMENTS

Patent Documents

Patent Document 1: JP 2005-114921 A
Patent Document 2: JP 2010-117629 A
Patent Document 3: WO 2010/147155
Patent Document 4: WO 2012/077640
Patent Document 5: PCT/JP2012/065625

SUMMARY OF THE INVENTION

Problem to be Solved by the Invention

The present invention provides a resist underlayer film-forming composition for a lithography process in production of a semiconductor device. According to the present invention, intermixing with a resist layer is not caused and an excellent resist pattern is obtained. The present invention provides a resist underlayer film for lithography having a selection ratio of dry etching rate close to that of a resist, a resist underlayer film for lithography having a smaller selection ratio of dry etching rate than that of the resist, and a resist underlayer film for lithography having a smaller selection ratio of dry etching rate than that of a semiconductor substrate. The present invention can impart a performance that effectively absorbs reflected light from a substrate when irradiated light having a wavelength of 248 mu, 193 nm, 157 nm, or the like is used for microprocessing. The present invention provides a method for forming a resist pattern using the resist underlayer film-forming composition. Further, the present invention provides a resist underlayer film-forming composition for forming a resist underlayer film having heat resistance.

Means for Solving the Problem

A first aspect of the present invention is a resist underlayer film-forming composition for lithography comprising a polymer having a unit structure of Formula (1):

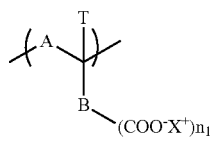

Formula (1)

(in Formula (1), A is a hydroxy group-substituted $C_{6-40}$ arylene group derived from a polyhydroxy aromatic compound; B is a $C_{6-40}$ arylene group or a $C_{4-30}$ heterocyclic group containing a nitrogen atom, an oxygen atom, a sulfur atom, or a combination thereof; $X^+$ is $H^+$, $NH_4^+$, a primary ammonium ion, a secondary ammonium ion, a tertiary ammonium ion, or a quaternary ammonium ion; T is a hydrogen atom, a $C_{1-10}$ alkyl group or a $C_{6-40}$ aryl group that may be substituted with a halogen group, a hydroxy group, a nitro group, an amino group, a carboxylate ester group, a nitrile group, or a combination thereof as a substituent, or a $C_{4-30}$ heterocyclic group containing a nitrogen atom, an oxygen atom, a sulfur atom, or a combination thereof; B and T may form a $C_{4-40}$ ring together with a carbon atom to which they are bonded; and n1 is an integer of 1 to the number of group(s) capable of being substituted with hydrogen atom(s) in the group defined by B or hydrogen atom(s) in the ring formed by bonding B and T.);

A second aspect of the present invention is the resist underlayer film-forming composition according to the first aspect, wherein the hydroxy group-substituted arylene group defined by A is a hydroxy group-substituted arylene group derived from benzenediol, benzenetriol, or naphthalenediol;

A third aspect of the present invention is the resist underlayer film-forming composition according to the first aspect, wherein the hydroxy group-substituted arylene group defined by A is a hydroxy group-substituted phenylene group derived from catechol, resorcinol, hydroquinone, pyrogallol, hydroxyquinol, or phloroglucinol;

A fourth aspect of the present invention is the resist underlayer film-forming composition according to any one of the first to third aspects, wherein the arylene group defined by B is an organic group based on a benzene ring, a naphthalene ring, or an anthracene ring, or an organic group based on a fluorene ring bonded to T;

A fifth aspect of the present invention is the resist underlayer film-forming composition according to any one of the first to third aspects, wherein the heterocyclic group defined by B is an organic group based on an optionally substituted furan ring, thiophene ring, pyrrole ring, carbazole ring, or dibenzofuran ring;

A sixth aspect of the present invention is the resist underlayer film-forming composition according to any one of the first to fifth aspects, wherein the arylene group or the heterocyclic group defined by B has a halogen group, a hydroxy group, a nitro group, an amino group, a carboxylate ester group, a nitrile group, or a combination thereof as a substituent;

A seventh aspect of the present invention is the resist underlayer film-forming composition according to any one of the first to sixth aspects, further comprising a crosslinker;

An eighth aspect of the present invention is a resist underlayer film obtained by applying the resist underlayer film-forming composition according to any one of the first to seventh aspects to a semiconductor substrate, followed by baking;

A ninth aspect of the present invention is a method for forming a resist pattern used in production of a semiconductor comprising a step of applying the resist underlayer film-forming composition according to any one of the first to seventh aspects to a semiconductor substrate followed by baking, to form an underlayer film;

A tenth aspect of the present invention is a method for producing a semiconductor device comprising steps of forming an underlayer film on a semiconductor substrate from the resist underlayer film-forming composition according to any one of the first to seventh aspects, forming a resist film on the underlayer film, forming a resist pattern by exposure to light or electron beam and development, etching the underlayer film through the resist pattern, and processing the semiconductor substrate through the patterned underlayer film;

An eleventh aspect of the present invention is a method for producing a semiconductor device comprising steps of forming a resist underlayer film on a semiconductor substrate from the resist underlayer film-forming composition according to any one of the first to seventh aspects, forming a hard mask on the resist underlayer film, forming a resist film on the hard mask, forming a resist pattern by exposure to light or electron beam and development, etching the hard mask through the resist pattern, etching the resist underlayer film through the patterned hard mask, and processing the semiconductor substrate through the patterned resist underlayer film; and A twelfth aspect of the present invention is the method according to the eleventh aspect, wherein the hard mask is formed by an applied inorganic substance or vapor deposition of an inorganic substance.

Effects of the Invention

According to a resist underlayer film-forming composition of the present invention, intermixing does not occur between an upper layer of a resist underlayer film and a layer covering the upper layer of a resist underlayer film, and a good pattern shape of a resist can be formed.

It is also possible to provide properties of efficiently suppressing reflection from a substrate to the resist underlayer film-forming composition of the present invention, whereby a resist underlayer film can also have an effect of an anti-reflective coating against exposure light.

According to the resist underlayer film-forming composition of the present invention, an excellent resist underlayer film having a selection ratio of dry etching rate close to that of a resist, a smaller selection ratio of dry etching rate than that of the resist, and a smaller selection ratio of dry etching rate than that of a semiconductor substrate can be provided.

In order to prevent collapse of developed resist pattern due to miniaturization of a resist pattern, the film thickness of the resist is decreased. For such a thin film resist, there are a process in which the resist pattern is transferred to an underlayer film thereof by an etching process, and a substrate is processed using the underlayer film as a mask, and a process in which the resist pattern is transferred to an underlayer film thereof by an etching process, and a step of transferring the pattern transferred to the underlayer film to another underlayer film thereof using different gas composition is repeated, and a substrate is finally processed. The resist underlayer film of the present invention and a composition forming the resist underlayer film are effective for the processes. When a substrate is processed using the resist underlayer film of the present invention, the resist underlayer film has a sufficient etching resistance relative to a processing substrate (e.g., thermal silicon oxide film, silicon nitride film, and poly-silicon film).

The resist underlayer film of the present invention can be used as a planarizing film, a resist underlayer film, a contamination prevention film of a resist layer, or a film having a dry etching selectivity. Therefore, a resist pattern can be easily formed with high precision in a lithography process for production of a semiconductor device.

Specifically, there is a process in which the resist underlayer film is formed on a substrate from the resist underlayer film-forming composition of the present invention, a hard mask is formed on the resist underlayer film, a resist film is formed on the hard mask, a resist pattern is formed by exposure and development, the resist pattern is transferred to the hard mask by dry etching, the resist pattern transferred to the hard mask by dry etching is transferred to the resist underlayer film, and the semiconductor substrate is processed using the resist underlayer film. In this case, when dry etching is carried out by a dry etching gas, the pattern obtained using the resist underlayer film of the present invention has excellent bending resistance (anti-wiggling).

In this process, the hard mask may be formed from a coating composition containing an organic polymer or an inorganic polymer (silicon polymer) and a solvent, or the hard mask may be formed by vacuum deposition of an inorganic substance. In vacuum deposition of an inorganic substance (e.g., silicon nitride oxide), a deposition substance is accumulated on the surface of the resist underlayer film, and at this time, the surface temperature of the resist underlayer film increases to about 400° C. Since the polymer used in the present invention is a polymer having many benzene-based unit structures, the heat resistance is very high, and thermal degradation does not occur even by accumulation of deposition substance. Further, since the resist underlayer film obtained by the present invention can be removed by an aqueous alkaline solution, a decrease in damage to the substrate during removal is expected.

MODES FOR CARRYING OUT THE INVENTION

The present invention is a resist underlayer film-forming composition for lithography containing a polymer having a unit structure of Formula (1).

In the present invention, the resist underlayer film-forming composition for lithography contains the polymer and a solvent. The resist underlayer film-forming composition may contain a crosslinker and an acid, and if necessary, an additive such as an acid generator and a surfactant. The solid content of the composition is 0.1 to 70% by mass, or 0.1 to 60% by mass. The solid content is a content ratio of all components other than the solvent in the resist underlayer film-forming composition. The solid content may contain the polymer in an amount of 1 to 100% by mass, 1 to 99.9% by mass, 50 to 99.9% by mass, 50 to 95% by mass, or 50 to 90% by mass. The polymer used in the present invention has a weight-average molecular weight of 600 to 1,000,000, or 600 to 200,000.

In Formula (1), A is a hydroxy group-substituted $C_{6-40}$ arylene group derived from a polyhydroxy aromatic compound, B is a $C_{6-40}$ arylene group or a $C_{4-30}$ heterocyclic group containing a nitrogen atom, an oxygen atom, a sulfur atom, or a combination thereof, $X^+$ is $H^+$ (hydrogen ion), $NH_4^+$, a primary ammonium ion, a secondary ammonium ion, a tertiary ammonium ion, or a quaternary ammonium ion, T is a hydrogen atom, a $C_{1-10}$ alkyl group or a $C_{6-40}$ aryl group that may be substituted with a halogen group, a hydroxy group, a nitro group, an amino group, a carboxylate ester group, a nitrile group, or a combination thereof as a substituent, or a $C_{4-30}$ heterocyclic group containing a nitrogen atom, an oxygen atom, a sulfur atom, or a combination thereof, B and T may form a $C_{4-40}$ ring together with a carbon atom to which they are bonded, and n1 is an integer of 1 to the number of group(s) capable of being substituted with hydrogen atom(s) in the group defined by B or hydrogen atom(s) in the ring formed by bonding B and T.

Examples of organic groups of a primary ammonium ion, a secondary ammonium ion, a tertiary ammonium ion, and a quaternary ammonium ion may include an alkyl group and an aryl group, and further examples may include the followings. The primary ammonium ion, the secondary ammonium ion, and the tertiary ammonium ion are derived from a primary amine, a secondary amine, and a tertiary amine, respectively. Examples thereof may include methylamine, ethylamine, phenylamine, dimethylamine, diethylamine, diphenylamine, trimethylamine, triethylamine, and triphenylaniine. Examples of the quaternary ammonium ion may include tetramethylammonium and tetraethylammonium.

The hydroxy group-substituted arylene group defined by A may be a hydroxy group-substituted arylene group derived from benzenediol, benzenetriol, or naphthalenediol. The hydroxy group-substituted arylene group defined by A may be a hydroxy group-substituted phenylene group derived from catechol, resorcinol, hydroquinone, pyrogallol, hydroxyquinol, or phloroglucinol.

The arylene group defined by B may be an organic group based on a benzene ring, a naphthalene ring, or an anthracene ring, or an organic group based on a fluorene ring bonded to T. The heterocyclic group defined by B may be an organic group based on an optionally substituted furan ring, thiophene ring, pyrrole ring, carbazole ring, or dibenzofuran ring. The arylene group or the heterocyclic group defined by B may have a halogen group, a hydroxy group, a nitro group, an amino group, a carboxylate ester group, a nitrile group, or a combination thereof as a substituent.

Examples of the halogen group may include a fluorine atom, a chlorine atom, a bromine atom, and an iodine atom.

The carboxylate ester group is a —COOR group, and R is a $C_{1-10}$ alkyl group or a $C_{6-40}$ aryl group.

Examples of the $C_{1-10}$ alkyl group may include a methyl group, an ethyl group, a n-propyl group, an i-propyl group, a cyclopropyl group, a n-butyl group, an i-butyl group, a s-butyl group, a tert-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{6-40}$ aryl group may include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenyl group, a m-biphenyl group, a p-biphenyl group, a 1-anthryl group, a 2-anthryl group, a 9-anthryl group, a 1-phenanthryl group, a 2-phenanthryl group, a 3-phenanthryl group, a 4-phenanthryl group, a pyrene group, and a 9-phenanthryl group.

Examples of a $C_{6-40}$ arylene group may include arylene groups corresponding to the $C_{6-40}$ aryl groups.

Examples of the unit structure of Formula (1) may include as follows.
Formula (1-1)
Formula (1-2)
Formula (1-3)
Formula (1-4)
Formula (1-5)
Formula (1-6)
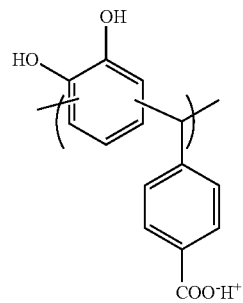
Formula (1-7)
Formula (1-8)
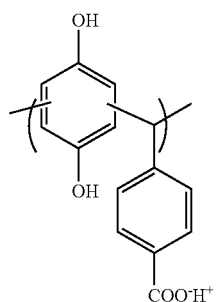
Formula (1-9)
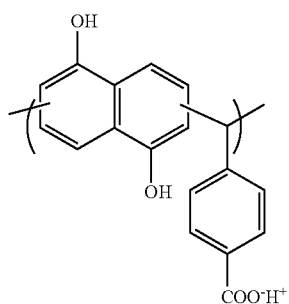
Formula (1-10)
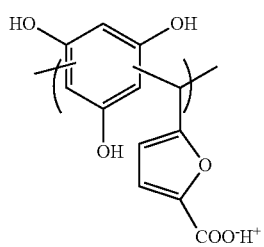

Formula (1-11)
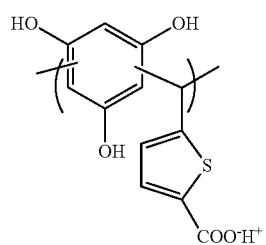
Formula (1-12)
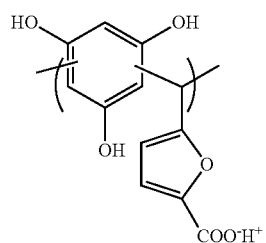
Formula (1-13)
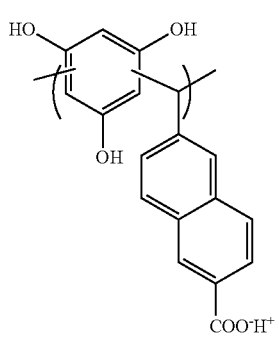
Formula (1-14)
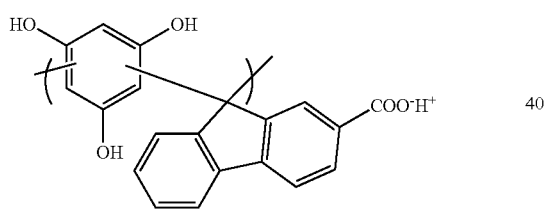
Formula (1-15)
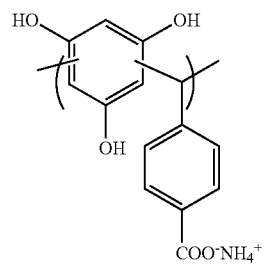
Formula (1-16)
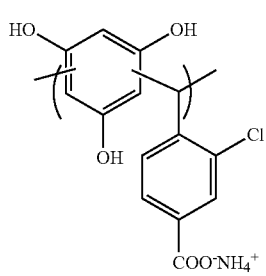
Formula (1-17)
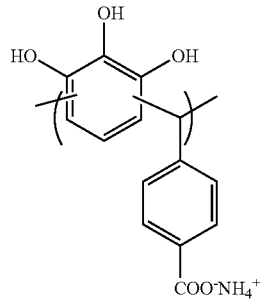
Formula (1-18)
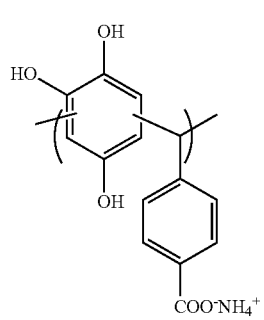
Formula (1-19)
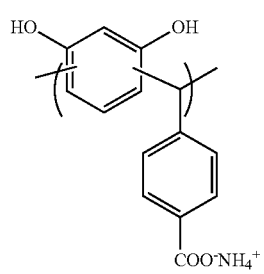
Formula (1-20)
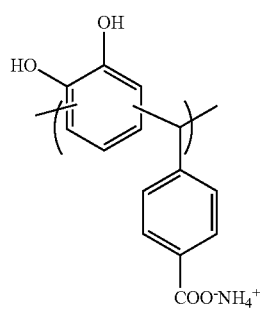
Formula (1-21)
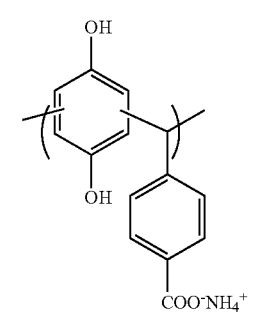

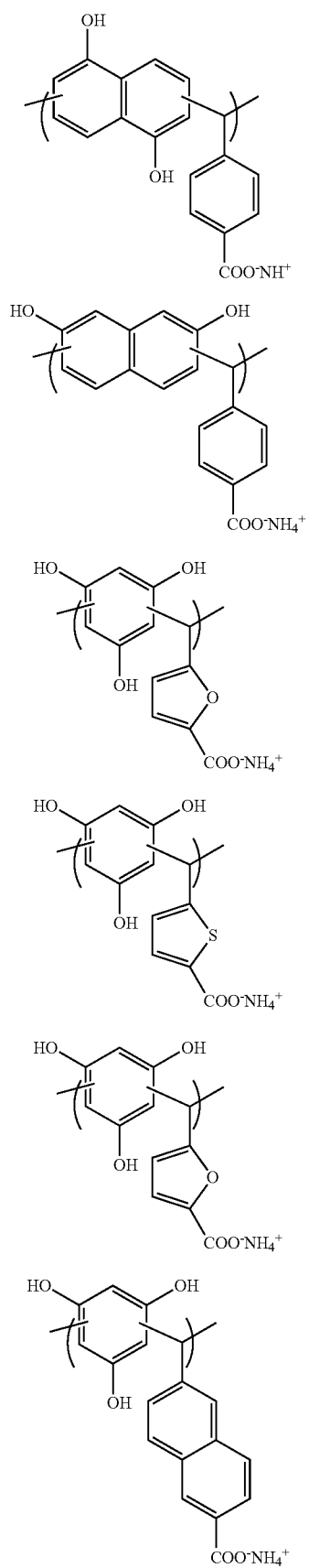
Formula (1-22)
Formula (1-23)
Formula (1-24)
Formula (1-25)
Formula (1-26)
Formula (1-27)
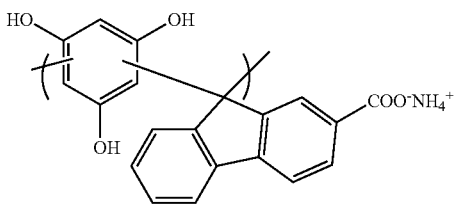
Formula (1-28)
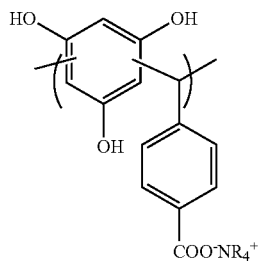
Formula (1-29)
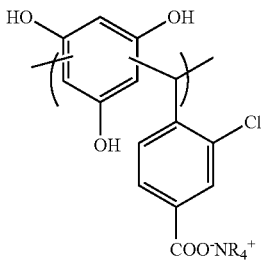
Formula (1-30)
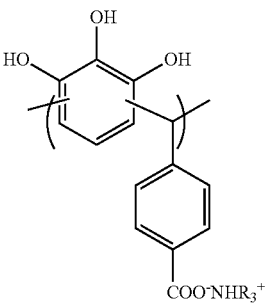
Formula (1-31)
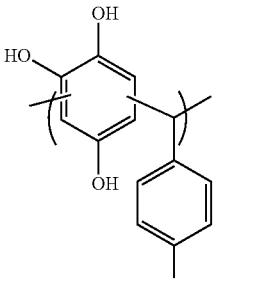
Formula (1-32)
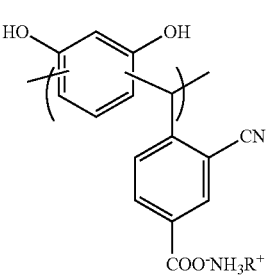
Formula (1-33)

Formula (1-34)
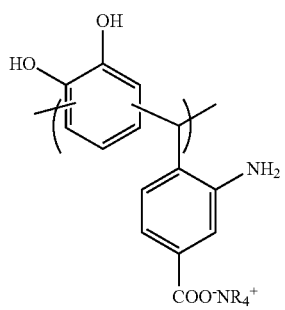

Formula (1-35)
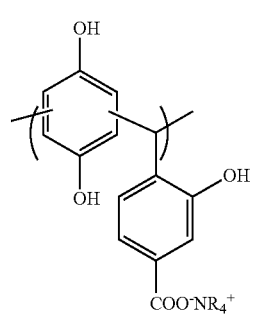

Formula (1-36)
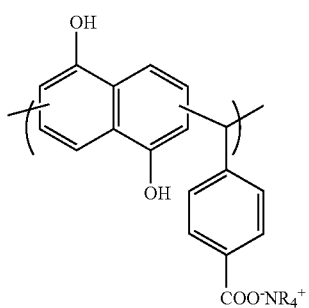

Formula (1-37)
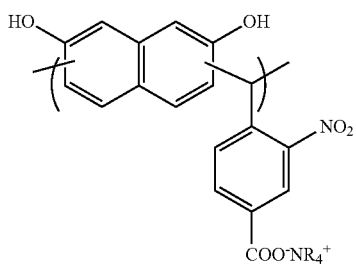

Formula (1-38)
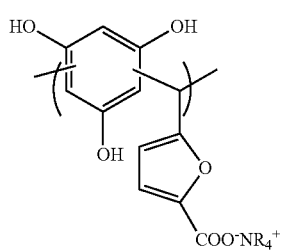

Formula (1-39)
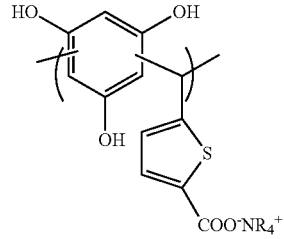

Formula (1-40)
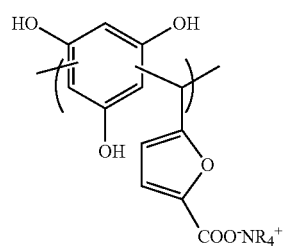

Formula (1-41)
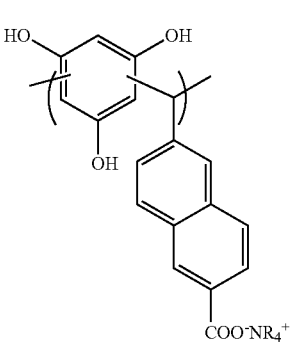

Formula (1-42)
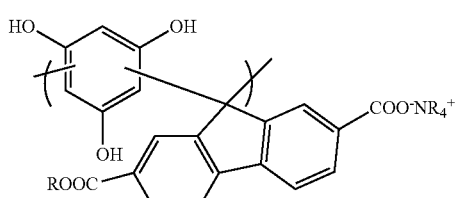

In Formulae (1-29) to (1-42), R is a $C_{1-10}$ alkyl group or a $C_{6-40}$ aryl group, and examples thereof may include groups exemplified above.

In the present invention, a novolac resin having a repeating unit structure of Formula (1) obtained by condensation of a polyhydroxy aromatic compound with aldehyde or ketone may be used as the polymer. The novolac resin can be obtained by condensation of a polyhydroxy aromatic compound with an aryl compound or a heterocyclic compound having an aldehyde group or a ketone group and a carboxylic acid group or a group of carboxylate salt with an acid.

Examples of the polyhydroxy aromatic compound may include benzenediol, benzenetriol, and naphthalenediol.

Specific examples of a benzene-based polyhydroxy aromatic compound may include catechol, resorcinol, hydroquinone, pyrogallol, hydroxyquinol, and phloroglucinol. Specific examples of a naphthalene-based polyhydroxy aromatic compound may include 2,7-dihydroxynaphthalene, 2,6-dihydroxynaphthalene, 1,4-dihydroxynaphthalene, 2,3-dihydroxynaphthalene, and 1,5-dihydroxynaphthalene.

The aryl compound or the heterocyclic compound is a compound having an aldehyde group or a ketone group and a carboxylic acid group or a group of carboxylate salt. Examples of a compound having an aldehyde group and a carboxyl group may include terephthalaldehyde acid and isophthalaldehyde acid. A heterocyclic compound having an aldehyde group and a carboxyl group, for example, formylfurancarboxylic acid, formylthiophenecarboxylic acid, or the like can be used.

Examples of a compound having a ketone group and a carboxyl group may include fluorenonecarboxylic acid.

In this reaction, aldehydes or ketones can be reacted in an amount of 0.1 to 10 mol, preferably 0.8 to 2.2 mol, and further preferably 1.0 mol, relative to 1 mol of the phenols.

As an acid catalyst used in the condensation reaction, mineral acids such as sulfuric acid, phosphoric acid, and perchloric acid, organic sulfonic acids such as p-toluenesulfonic acid and p-toluenesulfonic acid monohydrate, or carboxylic acids such as formic acid and oxalic acid are used. The amount of acid catalyst to be used is variously selected depending on the acids used. It is usually 0.001 to 10,000 parts by mass, preferably 0.01 to 1,000 parts by mass, and more preferably 0.1 to 100 parts by mass, relative to 100 parts by mass of the polyhydroxy aromatic compound and aldehyde or ketone in total.

The condensation reaction can be carried out without a solvent, but the condensation reaction is usually carried out using the solvent. Any solvent can be used as long as it does not inhibit the reaction. Examples thereof may include cyclic ethers such as tetrahydrofuran and dioxane. When the acid catalyst used is, for example, liquid like formic acid, it can also act as a solvent.

The reaction temperature during condensation is usually 40° C. to 200° C. The reaction time is variously selected depending on the reaction temperature, and the reaction time is usually about 30 minutes to about 50 hours.

The weight-average molecular weight Mw of the polymer obtained as described above is usually 600 to 1,000,000 or 600 to 200,000.

The resulting polymer having a carboxyl group can be converted into a carboxylate salt using an aqueous alkaline solution. As an alkaline substance, ammonia, a primary amine, a secondary amine, a tertiary amine, or a quaternary ammonium hydroxide can be used. As an organic group contained in amine or a quaternary ammonium, the alkyl group or the aryl group can be used.

The polymer can be mixed with another polymer in an amount of 30% by mass or less relative to the total polymer and used. Examples of the other polymer may include a polyacrylate ester compound, a polymethacrylate ester compound, a polyacrylamide compound, a polymethacrylamide compound, a polyvinyl compound, a polystyrene compound, a polymaleimide compound, a polymaleic acid anhydride, and a polyacrylonitrile compound.

Examples of a raw material monomer for the polyacrylate ester compound may include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, and 5-acryloyloxy-6-hydroxynorbornene-2-carboxylic-6-lactone.

Examples of a raw material monomer for the polymethacrylate ester compound may include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, n-lauryl methacrylate, n-stearyl methacrylate, methoxy diethylene glycol methacrylate, methoxy polyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone, and 2,2,3,3,4,4,4-heptafluorobutyl methacrylate.

Examples of a raw material monomer for the polyacrylamide compound may include acrylamide, N-methyl acrylamide, N-ethyl acrylamide, N-benzyl acrylamide, N-phenyl acrylamide, and N,N-dimethyl acrylamide.

Examples of a raw material monomer for the polymethacrylamide compound may include methacrylamide, N-methyl methacrylamide, N-ethyl methacrylamide, N-benzyl methacrylamide, N-phenyl methacrylamide, and N,N-dimethyl methacrylamide.

Examples of a raw material monomer for the polyvinyl compound may include vinyl ether, methyl vinyl ether, benzyl vinyl ether, 2-hydroxyethyl vinyl ether, phenyl vinyl ether, and propyl vinyl ether.

Examples of a raw material monomer for the polystyrene compound may include styrene, methyistyrene, chlorostyrene, bromostyrene, and hydroxystyrene.

Examples of a raw material monomer for the polymaleimide compound may include maleimide, N-methyl maleimide, N-phenyl maleimide, and N-cyclohexyl maleimide.

These polymers can be produced by dissolving an addition-polymerizable monomer and a chain transfer agent to be added if necessary (10% or less relative to the mass of the monomer) in an organic solvent, adding a polymerization initiator to cause a polymerization reaction, and adding a polymerization terminator. The amount of polymerization initiator to be added is 1 to 10% relative to the mass of the monomer, and the amount of polymerization terminator to be added is 0.01 to 0.2% by mass. Examples of the organic solvent used may include propylene glycol monomethyl ether, propylene glycol monopropyl ether, ethyl lactate, cyclohexanone, methyl ethyl ketone, and dimethylformamide. Examples of the chain transfer agent may include dodecanethiol and dodecyl thiol. Examples of the polymerization initiator may include azobisisobutyronitrile and azobiscyclohexanecarbonitrile. Examples of the polymerization terminator may include 4-methoxyphenol. The reaction temperature and the reaction time are appropriately selected from 30 to 100° C. and 1 to 48 hours, respectively.

The resist underlayer film-forming composition of the present invention may contain a crosslinker component. Examples of the crosslinker may include a melamine-based compound, a substituted urea-based compound, and polymers thereof. A crosslinker having at least two crosslink-forming substituents is preferred. Examples thereof may include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and butoxymethylated thiourea. A condensate thereof may be also used.

As the crosslinker, a crosslinker having high heat resistance may be used. As the crosslinker having high heat resistance, a compound containing a crosslink-forming substituent having an aromatic ring (e.g., benzene ring and naphthalene ring) in a molecule may be used.

Examples of the compound may include a compound having a substructure of Formula (2), and a polymer and an oligomer having a repeating unit of Formula (3).

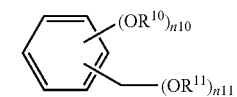

Formula (2)

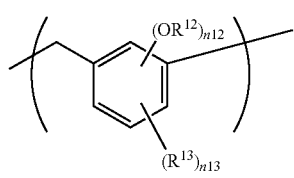

Formula (3)

In Formula (2), $R^{10}$ and $R^{11}$ are each a hydrogen atom, a $C_{1-10}$ alkyl group, or a $C_{6-20}$ aryl group, n10 is an integer of 1 to 4, n11 is an integer of 1 to (5-n10), and (n10+n11) is an integer of 2 to 5.

In Formula (3), $R^{12}$ is a hydrogen atom or a $C_{1-10}$ alkyl group, $R^{13}$ is a $C_{1-10}$ alkyl group, n12 is an integer of 1 to 4, n13 is an integer of 0 to (4-n12), and (n12+n13) is an integer of 1 to 4. The oligomer and the polymer in which the number of repeating unit structures falls within a range of 2 to 100 or 2 to 50 may be used.

The alkyl group and the aryl group can be exemplified by the above-described alkyl groups and aryl groups.

The compounds of Formula (2) and the polymer and the oligomer of Formula (3) are exemplified below.

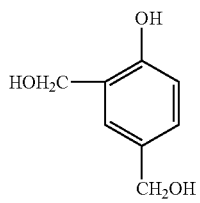

Formula (2-1)

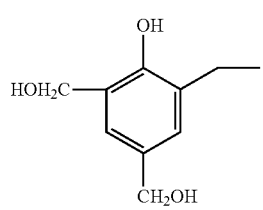

Formula (2-2)

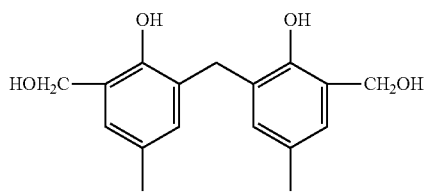

Formula (2-3)

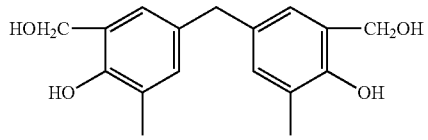

Formula (2-4)

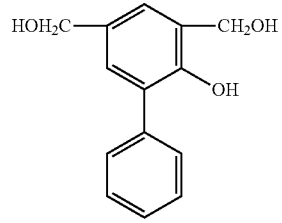

Formula (2-5)

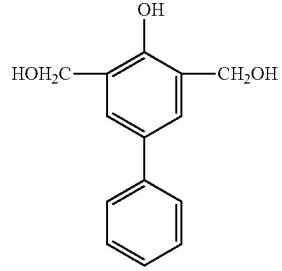

Formula (2-6)

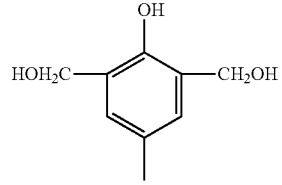

Formula (2-7)

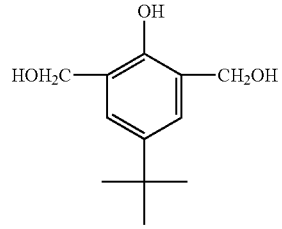

Formula (2-8)

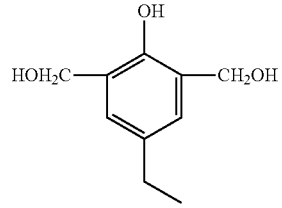

Formula (2-9)

-continued
Formula (2-10)
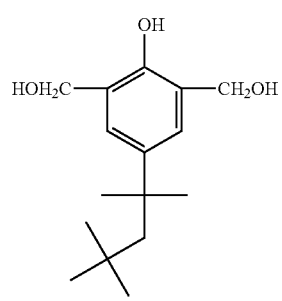
Formula (2-11)
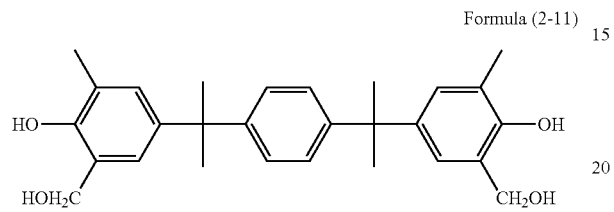
Formula (2-12)
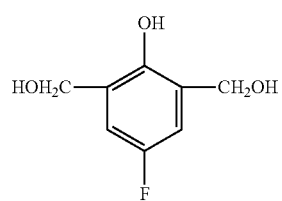
Formula (2-13)
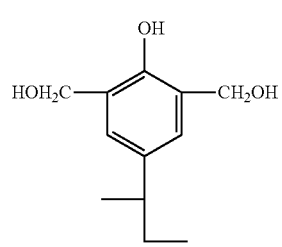
Formula (2-14)
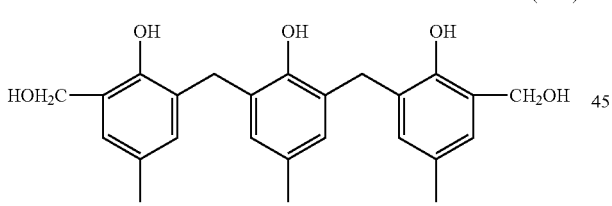
Formula (2-15)
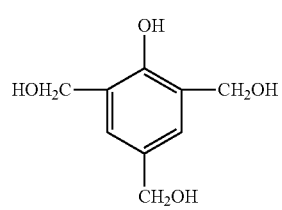
Formula (2-16)
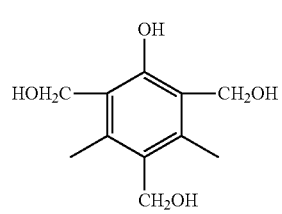
Formula (2-17)
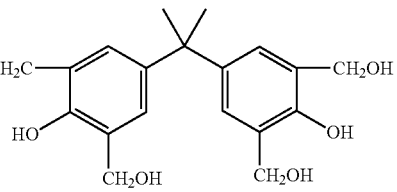
Formula (2-18)
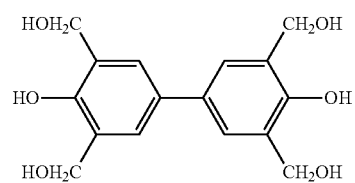
Formula (2-19)
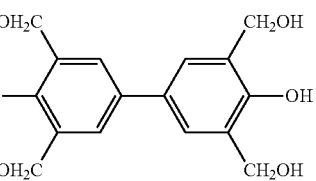
Formula (2-20)
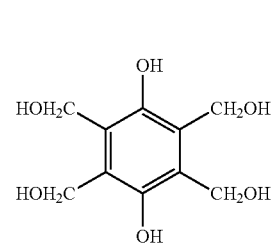
Formula (2-21)
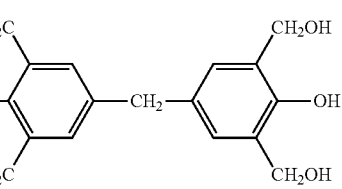
Formula (2-22)
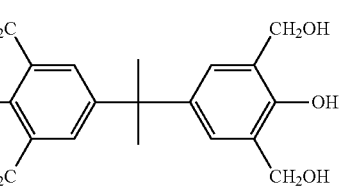
Formula (2-23)
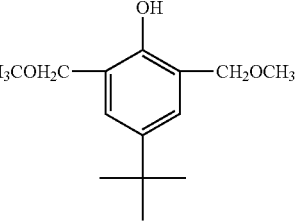

-continued

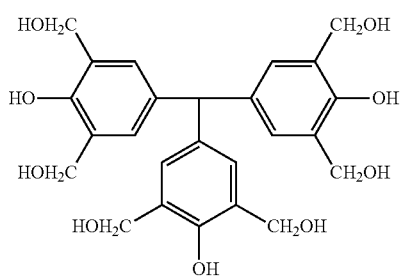

Formula (2-24)

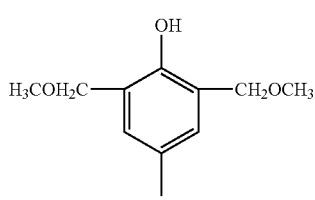

Formula (2-25)

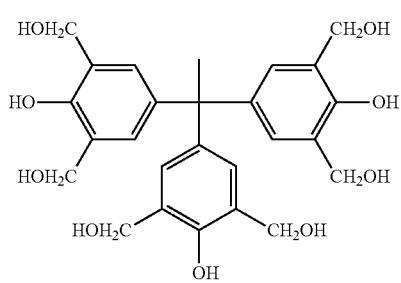

Formula (2-26)

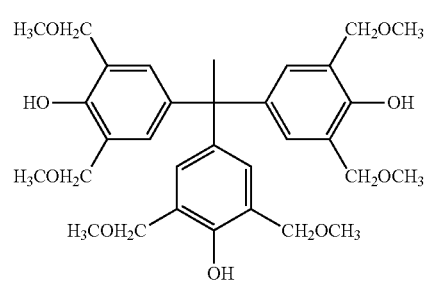

Formula (2-27)

The compounds are available as products from Asahi Organic Chemicals Industry Co., Ltd., and Honshu Chemical Industry Co., Ltd. Among the crosslinkers, for example, the compound of Formula (2-21) is available as trade name TM-SIP-A from Asahi Organic Chemicals Industry Co., Ltd.

The amount of crosslinker to be added varies depending on the coating solvent to be used, an underlying substrate to be used, a solution viscosity to be required, and a film form to be required. The crosslinker can be used in an amount of 0.001 to 80% by mass, preferably 0.01 to 50% by mass, and further preferably 0.05 to 40% by mass, relative to the total solid content. The crosslinker may cause a crosslinking reaction due to self-condensation. However, when the polymer of the present invention has a crosslinkable substituent, the crosslinker may cause a crosslinking reaction with the crosslinkable substituent.

In the present invention, as a catalyst for promoting the crosslinking reaction, an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalenecarboxylic acid, and/or a thermal acid generator such as 2,4,4,6-tetrabromocyclohexadienone, benzoin tosylate, 2-nitrobenzyl tosylate, and another organic alkyl sulfonate may be mixed. The amount of catalyst to be mixed is 0.0001 to 20% by mass, preferably 0.0005 to 10% by mass, and further preferably 0.01 to 3% by mass, relative to the total solid content.

A coating underlayer film-forming composition for lithography of the present invention may contain a photoacid generator in order to coincide with the acidity of a photoresist covering the upper layer at a lithography step. Preferable examples of the photoacid generator may include onium salt-based photoacid generators such as bis(4-tert-butylphenyl)iodonium trifluoromethanesulfonate and triphenylsulfonium trifluoromethanesulfonate, halogen-containing compound-based photoacid generators such as phenyl-bis(trichloromethyl)-s-triazine, and sulfonic acid-based photoacid generators such as benzoin tosylate and N-hydroxysuccinimide trifluoromethanesulfonate. The amount of the photoacid generator is 0.2 to 10% by mass, and preferably 0.4 to 5% by mass, relative to the total solid content.

In addition, a material for a resist underlayer film for lithography of the present invention may further contain a light absorber, a rheology controlling agent, an adhesive adjuvant, a surfactant, or the like, if necessary.

As the light absorber, for example, a commercially available light absorber described in "Kogyoyo shikiso no gijutsu to shijo" (CMC Publishing Co., Ltd.) or "Senryo binran" (edited by The Society of Synthetic Organic Chemistry, Japan.), for example, C. I. Disperse Yellow 1, 3, 4, 5, 7, 8, 13, 23, 31, 49, 50, 51, 54, 60, 64, 66, 68, 79, 82, 88, 90, 93, 102, 114, or 124; C. I. Disperse Orange 1, 5, 13, 25, 29, 30, 31, 44, 57, 72, or 73; C. I. Disperse Red 1, 5, 7, 13, 17, 19, 43, 50, 54, 58, 65, 72, 73, 88, 117, 137, 143, 199, or 210; C. I. Disperse Violet 43; C. I. Disperse Blue 96; C. I. Fluorescent Brightening Agent 112, 135, or 163; C. I. Solvent Orange 2 or 45; C. I. Solvent Red 1, 3, 8, 23, 24, 25, 27, or 49; C. I. Pigment Green 10; C. I. Pigment Brown 2, or the like may be suitably used. The light absorber is usually mixed in an amount of 10% by mass or less, and preferably 5% by mass or less, relative to the total solid content of the material for a resist underlayer film for lithography.

The rheology controlling agent is added to mainly improve the fluidity of the resist underlayer film-forming composition, and in particular, to improve the film thickness uniformity of the resist underlayer film and enhance the packing properties of the inside of holes with the resist underlayer film-forming composition at a baking step. Specific examples thereof may include a phthalic acid derivative such as dimethyl phthalate, diethyl phthalate, diisobutyl phthalate, dihexyl phthalate, and butyl isodecyl phthalate, an adipic acid derivative such as di-n-butyl adipate, diisobutyl adipate, diisooctyl adipate, and octyldecyl adipate, a maleic acid derivative such as di-n-butyl maleate, diethyl maleate, and dinonyl maleate, an oleic acid derivative such as methyl oleate, butyl oleate, and tetrahydrofurfuryl oleate, and a stearic acid derivative such as n-butyl stearate, and glyceryl stearate. The rheology controlling agent is usually mixed in an amount of less than 30% by mass, relative to the total solid content of the material for a resist underlayer film for lithography.

The adhesive adjuvant is added to mainly improve the adhesion of the substrate or the resist to the resist underlayer film-forming composition, and in particular, not to separate the resist by development. Specific examples thereof may include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilyl imidazole, silanes such as vinyltrichlorosilane, γ-chloropropyltrimethoxysilane, γ-aminopropyltriethoxysilane, and γ-glycidoxypropyltrimethoxysilane, a heterocyclic compound such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, an urea such as 1,1-dimethylurea and 1,3-dimethylurea, and a thiourea compound. The adhesive adjuvant is usually mixed in an amount of less than 5% by mass, and preferably less than 2% by mass, relative to the total solid content of the material for a resist underlayer film for lithography.

In the material for a resist underlayer film for lithography of the present invention, a surfactant can be mixed to further improve the coating properties against unevenness of a surface without generation of pinholes and striation. Examples of the surfactant may include a nonionic surfactant including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and a fluorosurfactant such as EFTOP EF301, EF303, and EF352 (trade name, manufactured by Tohkem Products Co., Ltd.), MEGAFAC F171, F173, and R-30 (trade name, manufactured by DIC Corporation), Fluorad FC430 and FC431 (trade name, manufactured by Sumitomo 3M, Ltd.), Asahi Guard AG710, and Surflon S-382, SC101, SC102, SC103, SC104, SC105, and SC106 (trade name, manufactured by Asahi Glass Co., Ltd.), and organosiloxane polymer KP341 (manufactured by Shin-Etsu Chemical Co., Ltd.). The amount of surfactant to be mixed is usually 2.0% by mass or less, and preferably 1.0% by mass or less, relative to the total solid content of the material for a resist underlayer film for lithography of the present invention. These surfactants may be added singly or in combination of two or more of them.

In the present invention, as a solvent capable of dissolving the polymer, the crosslinker component, the crosslinking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate can be used. These organic solvents can be used singly or in combination of two or more of them.

Further, a solvent having high boiling point, such as propylene glycol monobutyl ether and propylene glycol monobutyl ether acetate can be mixed in the organic solvent and the mixture can be used. Among the solvents, propylene glycol monomethyl ether, propylene glycol monomethyl ether acetate, ethyl lactate, butyl lactate, cyclohexanone, and the like are preferred in terms of improving leveling properties.

A resist used in the present invention is a photoresist or an electron beam resist.

As a photoresist applied to the top of the resist underlayer film for lithography in the present invention, any of a negative photoresist and a positive photoresist can be used, Examples thereof may include a positive photoresist including a novolac resin and 1,2-naphthoquinone diazide sulfonate ester; a chemically amplified photoresist including a binder having a group that increases the alkali dissolution rate by decomposition with an acid and a photoacid generator; a chemically amplified photoresist including an alkaline soluble binder, a low molecular compound that increases the alkali dissolution rate of the photoresist by decomposition with an acid, and a photoacid generator; a chemically amplified photoresist including a binder having a group that increases the alkali dissolution rate by decomposition with an acid, a low molecular compound that increases the alkali dissolution rate of the photoresist by decomposition with the acid, and a photoacid generator; and a photoresist having a Si atom in the framework. Specific examples thereof may include trade name APEX-E manufactured by Rohm and Haas.

Examples of an electron beam resist applied to the top of the resist underlayer film for lithography in the present invention may include a composition including a resin having a Si—Si bond in the main chain and an aromatic ring at the terminal and an acid generator that generates an acid by exposure to electron beam; and a composition including poly(p-hydroxyl styrene) in which a hydroxyl group is substituted with an organic group containing N-carboxyamine and an acid generator that generates an acid by exposure to electron beam. Using the latter electron beam resist composition, an acid generated from the acid generator by exposure to electron beam reacts with a N-carboxyaminoxy group of a polymer side chain, the polymer side chain decomposes into a hydroxyl group, the resultant product exhibits alkaline solubility, and is dissolved in an alkaline developer to form a resist pattern. Examples of the acid generator that generates an acid by exposure to electron beam may include a halogenated organic compound such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl) pyridine, an onium salt such as a triphenylsulfonium salt and a diphenyliodonium salt, and a sulfonate ester such as nitrobenzyl ditosylate and dinitrobenzyl tosylate.

As a developer of a resist having a resist underlayer film formed from the material for a resist underlayer film for lithography of the present invention, an aqueous solution of alkalies including inorganic alkalies such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, a quaternary ammonium salt such as tetramethylammonium hydroxide, tetraethylammonium hydroxide, and choline, and cyclic amines such as pyrrole and piperidine can be used. A solution in which alcohols such as isopropyl alcohol and a surfactant such as a nonionic surfactant are added in proper amounts to the aqueous solution of the alkalies can be used. Among the developers, a quaternary ammonium salt is preferred, and tetramethylammonium hydroxide and choline are further preferred.

Hereinafter, a method for forming a resist pattern of the present invention will be described. The resist underlayer film-forming composition is applied to a substrate used in production of a precision integrated circuit element (e.g., a transparent substrate such as a silicon/silicon dioxide coating, a glass substrate, and an ITO substrate) by an appropriate coating method using a spinner or a coater, baked, and cured to form a coating underlayer film. The thickness of the resist underlayer film is preferably 0.01 to 3.0 μm. A baking condition after coating is at 80 to 350° C. for 0.5 to 120 minutes. After then, a resist is applied directly to the resist underlayer film, or if necessary, after one or more layers of a coating material are formed on the resist underlayer film. The resist is exposed to light or electron beam through a predetermined mask, developed, washed, and dried. Thus, a good resist pattern can be obtained. If necessary, post exposure bake (PEB) can be also carried out after exposure to light or electron beam. The resist underlayer film at an area where the resist is developed and removed at the step can be removed by dry etching, to form a desired pattern on the substrate.

The exposure light of the photoresist is actinic radiation such as near ultraviolet light, far ultraviolet light, and extreme ultraviolet light (e.g., EUV, wavelength: 13.5 nm). For example, light with a wavelength of 248 nm (KrF laser beam), 193 nm (ArF laser beam), or 157 nm ($F_2$ laser beam) can be used. A method for light exposure can be used without particular restriction as long as it is a method capable of generating an acid from the photoacid generator. The exposure is 1 to 2,000 mJ/cm$^2$, 10 to 1,500 mJ/cm$^2$, or 50 to 1,000 mJ/cm$^2$. In exposure of the electron beam resist to electron beam, for example, an electron beam irradiating device can be used.

In the present invention, a semiconductor device can be produced through steps of forming the resist underlayer film on a semiconductor substrate from the resist underlayer film-forming composition, forming a resist film on the resist underlayer film, forming a resist pattern by exposure to light or electron beam and development, etching the resist underlayer film through the resist pattern, and processing the semiconductor substrate through the patterned resist underlayer film.

When miniaturization of the resist pattern advances, problems of resolution and collapse of developed resist pattern are caused. Therefore, a decrease in film thickness of the resist is desired. In this case, it is difficult to obtain a resist pattern film thickness sufficient for substrate processing. A process that imparts a function of a mask during the substrate processing to not only the resist pattern but also the resist underlayer film that is formed between the resist and the semiconductor substrate to be processed is required. The present invention can provide, as the resist underlayer film for such a process, a resist underlayer film for lithography having a selection ratio of dry etching rate close to the resist, which is different from the conventional resist underlayer film having high etching rate, a resist underlayer film for lithography having a smaller selection ratio of dry etching rate than that of the resist, and a resist underlayer film for lithography having a smaller selection ratio of dry etching rate than that of the semiconductor substrate. To such a resist underlayer film, an anti-reflective performance may be imparted, and the resist underlayer film may also have a function of the conventional anti-reflective coating.

In order to obtain finer resist pattern, a process in which the resist pattern and the resist underlayer film are made finer than the pattern width during resist development by dry etching of the resist underlayer film is also used. The present invention can also provide a resist underlayer film having a selection ratio of dry etching close to that of the resist, which is different from the conventional anti-reflective coating having high etching rate, as the resist underlayer film for such a process. To such a resist underlayer film, the anti-reflective performance may be imparted, and the resist underlayer film may also have a function of the conventional anti-reflective coating.

In the present invention, the resist underlayer film of the present invention is formed on the substrate, and the resist may be applied directly to the resist underlayer film, or if necessary, after one or more layers of the coating material are formed on the resist underlayer film. In this case, even when the pattern width of the resist decreases and the resist is thinly applied to prevent pattern collapse, the substrate can be processed by selection of appropriate etching gas.

Specifically, the semiconductor device can be produced through steps of forming the resist underlayer film on a semiconductor substrate from the resist underlayer film-forming composition, forming a hard mask from a coating material containing a silicon component or the like on the resist underlayer film or a hard mask (e.g., from silicon nitride oxide) by vapor deposition, forming a resist film on the hard mask, forming a resist pattern by exposure to light or electron beam and development, etching the hard mask through the resist pattern by halogen-based gas, etching the resist underlayer film through the patterned hard mask by oxygen-based gas or hydrogen-based gas, and processing the semiconductor substrate through the patterned resist underlayer film by halogen-based gas.

In consideration of effects as the anti-reflective coating, since a light absorption portion is incorporated in the framework of the resist underlayer film-forming composition for lithography of the present invention, a substance is not diffused in the photoresist during heating and drying. And as the light absorption portion has sufficiently large light absorption performance, the resist underlayer film-forming composition has high reflective light prevention effect.

The resist underlayer film-forming composition for lithography of the present invention has high thermal stability, and can prevent pollution to the top layer due to the decomposed substance during baking, and impart a margin of temperature at a baking step.

The material for a resist underlayer film for lithography of the present invention can be used for a film having a function of preventing reflection of light depending on the process conditions, and a function of preventing an interaction between a substrate and a photoresist or preventing a material used for the photoresist or a substance produced by exposure to the photoresist from causing adverse effects on a substrate.

EXAMPLES

Synthesis Example 1

20.0 g of phloroglucinol (manufactured by Tokyo Chemical Industry Co., Ltd.), 20.3 g of terephthalaldehyde acid (manufactured by Tokyo Chemical Industry Co., Ltd.), and 120.8 g of propylene glycol monomethyl ether were placed in a 300-mL flask. After then, the mixture was stirred for about 5 hours under heating-reflux. After completion of the reaction, ion-exchange treatment was carried out to obtain a brownish-red phloroglucinol resin solution. The resulting polymer corresponded to Formula (1-1). The weight-average molecular weight Mw measured by GPC in terms of polystyrene was 2,450, and the polydispersity Mw/Mn was 1.6.

Synthesis Example 2

5.1 g of phloroglucinol (manufactured by Tokyo Chemical Industry Co., Ltd.), 6.5 g of 1,5-dihydroxynaphthalene (manufactured by Tokyo Chemical Industry Co., Ltd.), 9.2 g of terephthalaldehyde acid (manufactured by Tokyo Chemical Industry Co., Ltd.), and 62.3 g of propylene glycol monomethyl ether were placed in a 100-mL flask. After then, the mixture was stirred for about 3 hours under heating-reflux. After completion of the reaction, ion-exchange treatment was carried out to obtain a brownish-red resin solution. The resulting polymer corresponded to a copolymer containing unit structures of Formulae (1-1) and (1-8). The weight-average molecular weight Mw measured by GPC in terms of polystyrene was 4,430, and the polydispersity Mw/Mn was 6.4.

Synthesis Example 3

5.5 g of phloroglucinol (manufactured by Tokyo Chemical Industry Co., Ltd.), 4.8 g of resorcinol (manufactured by Tokyo Chemical Industry Co., Ltd.), 10.7 g of terephthalaldehyde acid (manufactured by Tokyo Chemical Industry Co., Ltd.), and 63.1 g of propylene glycol monomethyl ether were placed in a 100-mL flask. After then, the mixture was stirred for about 3 hours under heating-reflux. After completion of the reaction, ion-exchange treatment was carried out to obtain a brownish-red phloroglucinol resin solution. The resulting polymer corresponded to a copolymer containing unit structures of Formulae (1-1) and (1-5). The weight-average molecular weight Mw measured by GPC in terms of polystyrene was 3,000, and the polydispersity Mw/Mn was 1.9.

Comparative Synthesis Example 1

12.0 g of phloroglucinol (manufactured by Tokyo Chemical Industry Co., Ltd.), 10.1 g of benzaldehyde (manufactured by Tokyo Chemical Industry Co., Ltd.), 53.7 g of propylene glycol monomethyl ether, and 0.92 g of methanesulfonic acid (manufactured by Tokyo Chemical Industry Co., Ltd.) were placed in a 100-mL eggplant-shaped flask. After then, the mixture was stirred for about 4 hours under heating-reflux. After completion of the reaction, ion-exchange treatment was carried out to obtain a brownish-red phloroglucinol resin solution. The resulting polymer corresponded to Formula (3-1). The weight-average molecular weight Mw measured by GPC in terms of polystyrene was 1,870, and the polydispersity Mw/Mn was 1.6.

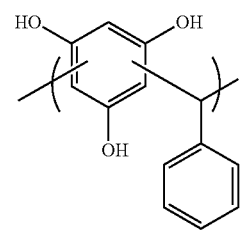

Formula (3-1)

Comparative Synthesis Example 2

45.0 g of phloroglucinol (manufactured by Tokyo Chemical Industry Co., Ltd.), 43.6 g of 4-hydroxybenzaldehyde (manufactured by Tokyo Chemical Industry Co., Ltd.), 170.9 g of propylene glycol monomethyl ether, and 3.46 g of methanesulfonic acid (manufactured by Tokyo Chemical Industry Co., Ltd.) were placed in a 300-mL eggplant-shaped flask. After then, the mixture was stirred for about 3 hours under heating-reflux. After completion of the reaction, ion-exchange treatment was carried out to obtain a brownish-red phloroglucinol resin solution. The resulting polymer corresponded to Formula (3-2). The weight-average molecular weight Mw measured by GPC in terms of polystyrene was 1,260, and the polydispersity Mw/Mn was 1.5.

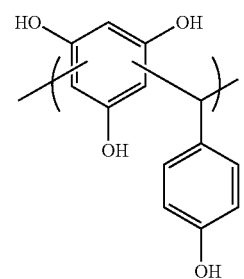

Formula (3-2)

Example 1

2 g (solid content) of the resin obtained in Synthesis Example 1 and 0.3 g of tetramethoxymethyl glycoluril were dissolved in 16.1 g of propylene glycol monomethyl ether and 6.9 g of propylene glycol monomethyl ether acetate to prepare a solution of a resist underlayer film-forming composition used in a lithography process using a multilayer film.

Example 2

2 g (solid content) of the resin obtained in Synthesis Example 2 and 0.3 g of tetramethoxymethyl biphenol were dissolved in 16.1 g of propylene glycol monomethyl ether and 6.9 g of propylene glycol monomethyl ether acetate to prepare a solution of a resist underlayer film-forming composition used in a lithography process using a multilayer film.

Example 3

2 g (solid content) of the resin obtained in Synthesis Example 3 and 0.3 g of tetramethoxymethyl glycoluril were dissolved in 16.1 g of propylene glycol monomethyl ether and 6.9 g of propylene glycol monomethyl ether acetate to prepare a solution of a resist underlayer film-forming composition used in a lithography process using a multilayer film.

Comparative Example 1

1 g (solid content) of cresol novolac resin (commercial product, weight-average molecular weight: 4,000) was dissolved in 10.34 g of propylene glycol monomethyl ether and 2.59 g of cyclohexanone to prepare a solution of a resist underlayer film-forming composition used in a lithography process using a multilayer film.

Comparative Example 2

2 g (solid content) of the resin obtained in Comparative Synthesis Example 1 was dissolved in 0.3 g of tetramethoxymethyl glycoluril, 16.1 g of propylene glycol monomethyl ether, and 6.9 g of propylene glycol monomethyl ether acetate to prepare a solution of a resist underlayer film-forming composition used in a lithography process using a multilayer film.

Comparative Example 3

2 g (solid content) of the resin obtained in Comparative Synthesis Example 2 was dissolved in 0.3 g of tetramethoxymethyl glycoluril, 16.1 g of propylene glycol monomethyl ether, and 6.9 g of propylene glycol monomethyl ether acetate to prepare a solution of a resist underlayer film-forming composition used in a lithography process using a multilayer film.

(Measurement of Optical Parameter)

Each solution of resist underlayer film-forming composition prepared in Examples 1 to 3 and Comparative Examples 1 to 3 was applied to a silicon wafer using a spin coater. The silicon wafer was baked on a hot plate at 240° C. for 1 minute) to form a resist underlayer film (thickness: 0.05 vim). The refractive index (n value) and the light absorption coefficient (k value, also referred to as attenuation coefficient) of the resist underlayer film were measured at a wavelength of 193 nm using a spectroscopic ellipsometer. The results are shown in Table 1.

TABLE 1

Table 1 Refractive index n and light absorption coefficient k

|  |  | n | k |
|---|---|---|---|
| Example 1 | Film baked at 240° C. | 1.41 | 0.60 |
| Example 2 | Film baked at 240° C. | 1.42 | 0.56 |
| Example 3 | Film baked at 240° C. | 1.39 | 0.65 |
| Comparative Example 1 | Film baked at 240° C. | 1.53 | 0.42 |
| Comparative Example 2 | Film baked at 240° C. | 1.57 | 0.85 |
| Comparative Example 3 | Film baked at 240° C. | 1.47 | 0.69 |

(Measurement of Dry Etching Rate)

As an etcher and an etching gas used in the measurement of dry etching rate, the following etcher and gas were used.
RIE-10NR (manufactured by SAMCO INC.): $CF_4$ Each solution of resist underlayer film-forming composition prepared in Examples 1 to 3 and Comparative Examples 2 to 3 was applied to a silicon wafer using a spin coater. The silicon wafer was baked on a hot plate at 240° C. for 1 minute and at 400° C. for 2 minute (at 240° C. for 1 minute in Comparative Example 1), to form a resist underlayer film (thickness: 0.20 μm). The dry etching rate was measured using $CF_4$ gas as an etching gas.

The solution in Comparative Example 1 was applied to a silicon wafer using a spin coater to form a film. The dry etching rate was measured using $CF_4$ gas as an etching gas. The dry etching rates of the resist underlayer films in Examples 1 to 3 and Comparative Examples 2 and 3 were compared with the dry etching rate of the resist underlayer film in Comparative Example 1. The results are shown in Table 2. A rate ratio is a ratio of the dry etching rates of (the resist underlayer film obtained in each of Examples 1 to 3 and Comparative Examples 2 and 3)/(the resist underlayer film obtained Comparative Example 1).

TABLE 2

Table 2 Dry etching rate ratio

| Rate ratio of (resist underlayer film in Example 1) | 1.25 |
|---|---|
| Rate ratio of (resist underlayer film in Example 2) | 1.18 |
| Rate ratio of (resist underlayer film in Example 3) | 1.23 |
| Rate ratio of (resist underlayer film in Comparative Example 2) | 0.98 |
| Rate ratio of (resist underlayer film in Comparative Example 3) | 1.15 |

(Elution Test into Photoresist Solvent)

Each solution of resist underlayer film-forming composition prepared in Examples 1 to 3 and Comparative Examples 1 to 3 was applied to a silicon wafer using a spin coater. The silicon wafer was baked on a hot plate at 240° C. for 1 minute to form a resist underlayer film (thickness: 0.20 μm). The resist underlayer film was subjected to an immersion test in a solvent used for a resist, such as propylene glycol monomethyl ether and propylene glycol monomethyl ether acetate. The results are shown in Table 3. A remaining film ratio was obtained by immersing the resist underlayer film in each solvent for 60 seconds, measuring the thickness before and after the immersion, and calculating (film thickness after the immersion)/(film thickness before the immersion)×100.

TABLE 3

Table 3 Remaining film ratio (%) after elution test

|  |  | PGME | PGMEA |
|---|---|---|---|
| Example 1 | Film baked at 240° C. | 100 | 100 |
| Example 2 | Film baked at 240° C. | 100 | 100 |
| Example 3 | Film baked at 240° C. | 100 | 100 |
| Comparative Example 1 | Film baked at 240° C. | 100 | 100 |
| Comparative Example 2 | Film baked at 240° C. | 0 | 0 |
| Comparative Example 3 | Film baked at 240° C. | 93 | 98 |

(Dissolution Test of Alkaline Liquid)

Each solution of resist underlayer film-forming composition prepared in Examples 1 to 3 was applied to a silicon wafer using a spin coater. The silicon wafer was baked on a hot plate at 240° C. for 1 minute to form a resist underlayer film (thickness: 0.20 μm). The resist underlayer film was subjected to an immersion test in 2.38% by mass tetramethylammonium hydroxide aqueous solution. The results are shown in Table 4. The resist underlayer film was immersed in 2.38% by mass tetramethylammonium hydroxide aqueous solution for 60 seconds, and the overview of the immersed film was observed. A case where the film does not remain is considered as removable, and a case where the film remains is considered as nonremovable.

TABLE 4

Table 4 Results of dissolution test of alkaline liquid)

| | | |
|---|---|---|
| Example 1 | Film baked at 240° C. | Removable |
| Example 2 | Film baked at 240° C. | Removable |
| Example 3 | Film baked at 240° C. | Removable |
| Comparative Example 1 | Film baked at 240° C. | Nonremovable |
| Comparative Example 2 | Film baked at 240° C. | Removable |
| Comparative Example 3 | Film baked at 240° C. | Removable |

INDUSTRIAL APPLICABILITY

The material for a resist underlayer film for a lithography process using a multilayer film of the present invention has high dry etching resistance, which is different from a conventional anti-reflective coating having high etching rate. The material has characteristics of a hard mask. Conventionally, ashing (removal using ashing) is used in removal of the resist underlayer film. However, since the resist underlayer film obtained by the present invention can be removed by an aqueous alkaline solution, a decrease in damage to a substrate during removal is expected.

The invention claimed is:

1. A resist underlayer film-forming composition for lithography comprising:

a polymer having a unit structure of Formula (1):

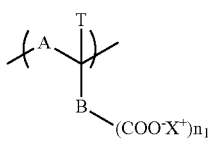

Formula (1)

wherein:
A is a benzenediol group, a benzenetriol group, or a naphthalenediol group;
B is a $C_{6-40}$ arylene group and is an organic group based on a benzene ring, a naphthalene ring, or an anthracene ring, or an organic group based on a fluorene ring bonded to T, or a $C_{4-30}$ heterocyclic group containing a nitrogen atom, an oxygen atom, a sulfur atom, or a combination thereof and is an organic group based on an optionally substituted furan ring, thiophene ring, pyrrole ring, carbazole ring, or dibenzofuran ring;
$X^+$ is $H^+$, $NH_4^+$, a primary ammonium ion, a secondary ammonium ion, a tertiary ammonium ion, or a quaternary ammonium ion,
T is a hydrogen atom, a $C_{1-10}$ alkyl group or a $C_{6-40}$ aryl group that may be substituted with a halogen group, a hydroxy group, a nitro group, an amino group, a carboxylate ester group, a nitrile group, or a combination thereof as a substituent, or a $C_{4-30}$ heterocyclic group containing a nitrogen atom, an oxygen atom, a sulfur atom, or a combination thereof,
B and T may form a $C_{4-40}$ ring together with a carbon atom to which they are bonded, and n1 is an integer of 1 to the number of group(s) capable of being substituted with hydrogen atom(s) in the group defined by B or hydrogen atom(s) in the ring formed by bonding B and T, and
a crosslinker,
wherein the composition has a solid content of 0.1 to 70% by mass, wherein a cured resist underlayer film formed from the resist underlayer film-forming composition after baking at 240° C. for 1 minute is not soluble when immersed in a photoresist solvent composed of propylene glycol monomethyl ether or propylene glycol monomethyl ether acetate but is removable when immersed in an aqueous solution of tetramethylammonium hydroxide and without ashing, and wherein the polymer having a unit structure of Formula (1) is a polymer having a unit structure corresponding to the following Formula (1-1):

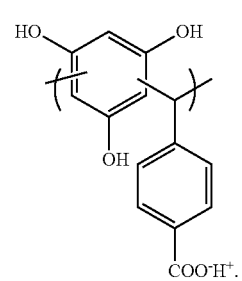

Formula (1-1)

2. The resist underlayer film-forming composition according to claim 1, wherein B is said arylene group.

3. The resist underlayer film-forming composition according to claim 2, wherein said arylene group is an organic group based on an anthracene ring.

4. The resist underlayer film-forming composition according to claim 2, wherein said arylene group is an organic group is based on an organic group based on a fluorene ring bonded to T.

5. The resist underlayer film-forming composition according to claim 1, wherein B is said heterocyclic group.

6. The resist underlayer film-forming composition according to claim 1, wherein the arylene group or the heterocyclic group defined by B has a halogen group, a hydroxy group, a nitro group, an amino group, a carboxylate ester group, a nitrile group, or a combination thereof as a substituent.

7. The resist underlayer film-forming composition according to claim 1, wherein the crosslinker has the substructure of Formula (2), or is a polymer or oligomer having a repeating unit of Formula (3), as follows:

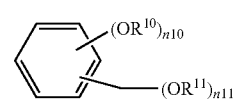

Formula (2)

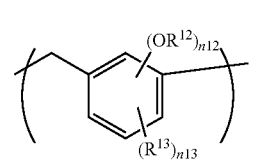

Formula (3)

wherein, in Formula (2), $R^{10}$ and $R^{11}$ are each a hydrogen atom, a $C_{1-10}$ alkyl group, or a $C_{6-20}$ aryl group, n10 is an integer of 1 to 4, n11 is an integer of 1 to (5-n10), and (n10+n11) is an integer of 2 to 5;

in Formula (3), $R^{12}$ is a hydrogen atom or a $C_{1-10}$ alkyl group, $R^{13}$ is a $C_{1-10}$ alkyl group, n12 is an integer of 1 to 4, n13 is an integer of 0 to (4-n12), (n12+n13) is an integer of 1 to 4, and the number of repeating unit structures falls within a range of 2 to 100.

8. The resist underlayer film-forming composition according to claim 1, wherein the hydroxy group-substituted arylene group defined by A is a benzenediol group or a benzenetriol group.

9. The resist underlayer film-forming composition according to claim 1, wherein the polymer having a unit structure of Formula (1) is a copolymer having a unit structure corresponding to Formula (1-1) and a unit structure corresponding to the following Formula (1-8):

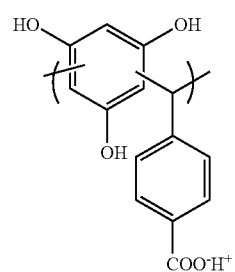

Formula (1-1)

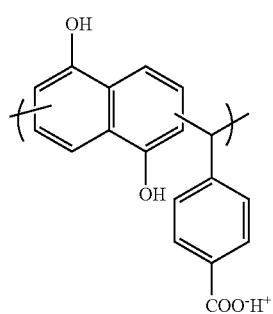

Formula (1-8)

10. The resist underlayer film-forming composition according to claim 1, wherein the polymer having a unit structure of Formula (1) is a copolymer having a unit structure corresponding to Formula (1-1) and a unit structure corresponding to the following Formula (1-5):

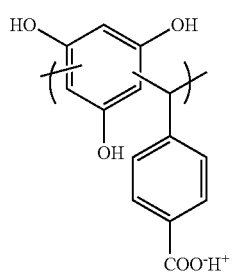

(Formula (1-1))

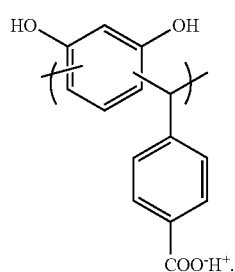

Formula (1-5)

11. A resist underlayer film obtained by applying the resist underlayer film-forming composition according to claim 1 to a semiconductor substrate, followed by baking.

12. A method for forming a resist pattern used in production of a semiconductor comprising a step of applying the resist underlayer film-forming composition according to claim 1 to a semiconductor substrate, followed by baking, to form an underlayer film.

13. A method for producing a semiconductor device comprising steps of forming an underlayer film on a semiconductor substrate from the resist underlayer film-forming composition according to claim 1, forming a resist film on the underlayer film, forming a resist pattern by exposure to light or electron beam and development, etching the underlayer film through the resist pattern, and processing the semiconductor substrate through the patterned underlayer film.

14. A method for producing a semiconductor device comprising steps of forming a resist underlayer film on a semiconductor substrate from the resist underlayer film-forming composition according to claim 1, forming a hard mask on the resist underlayer film, forming a resist film on the hard mask, forming a resist pattern by exposure to light or electron beam and development, etching the hard mask through the resist pattern, etching the resist underlayer film through the patterned hard mask, and processing the semiconductor substrate through the patterned resist underlayer film.

15. The method according to claim 14, wherein the hard mask is formed by an applied inorganic substance or vapor deposition of an inorganic substance.

16. A resist underlayer film-forming composition for lithography comprising:
a polymer having a unit structure of Formula (1):

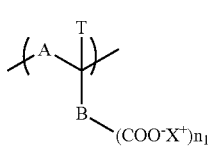

Formula (1)

wherein:
A is a benzenediol group, a benzenetriol group, a naphthalenediol group, or the following polyhydroxy-substituted structures:

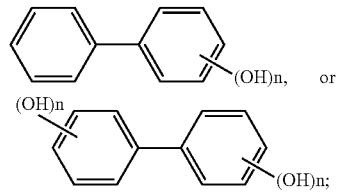

B is a $C_{6-40}$ arylene group or a $C_{4-30}$ heterocyclic group containing a nitrogen atom, an oxygen atom, a sulfur atom, or a combination thereof;

$X^+$ is $H^+$, $NH_4^+$, a primary ammonium ion, a secondary ammonium ion, a tertiary ammonium ion, or a quaternary ammonium ion, T is a hydrogen atom, a $C_{1-10}$ alkyl group or a $C_{6-40}$ aryl group that may be substituted with a halogen group, a hydroxy group, a nitro group, an amino group, a carboxylate ester group, a nitrile group, or a combination thereof as a substituent, or a $C_{4-30}$ heterocyclic group containing a nitrogen atom, an oxygen atom, a sulfur atom, or a combination thereof, B and T may form a $C_{4-40}$ ring together with a carbon atom to which they are bonded, and n1 is an integer of 1 to the number of group(s) capable of being substituted with hydrogen atom(s) in the group defined by B or hydrogen atom(s) in the ring formed by bonding B and T, and a crosslinker, wherein the composition has a solid content of 0.1 to 70% by mass, wherein a cured resist underlayer film formed from the resist underlayer film-forming composition after baking at 240° C. for 1 minute is not soluble when immersed in a photoresist solvent composed of propylene glycol monomethyl ether or propylene glycol monomethyl ether acetate but is removable when immersed in an aqueous solution of tetramethylammonium hydroxide, and wherein the polymer having a unit structure of Formula (1) is a polymer having a unit structure corresponding to the following Formula (1-1):

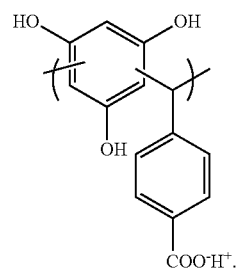

Formula (1-1)

* * * * *